United States Patent
Chen et al.

(10) Patent No.: US 9,847,320 B2
(45) Date of Patent: Dec. 19, 2017

(54) SEMICONDUCTOR STRUCTURE AND METHOD OF FABRICATING THE SAME

(71) Applicant: TAIWAN SEMICONDUCTOR MANUFACTURING COMPANY LTD., Hsinchu (TW)

(72) Inventors: Chien Hsun Chen, Pingtung County (TW); William Wu Shen, Hsinchu (TW); Jiun Yi Wu, Taoyuan County (TW); Chien Hsun Lee, Hsin-Chu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 15/172,743

(22) Filed: Jun. 3, 2016

(65) Prior Publication Data
US 2017/0263588 A1  Sep. 14, 2017

Related U.S. Application Data

(60) Provisional application No. 62/305,950, filed on Mar. 9, 2016.

(51) Int. Cl.
| | | |
|---|---|---|
| *H01L 23/02* | (2006.01) | |
| *H01L 25/065* | (2006.01) | |
| *H01L 25/00* | (2006.01) | |
| *H01L 25/04* | (2014.01) | |
| *H01L 25/07* | (2006.01) | |

(52) U.S. Cl.
CPC ........ *H01L 25/0657* (2013.01); *H01L 25/043* (2013.01); *H01L 25/0652* (2013.01); *H01L 25/071* (2013.01); *H01L 25/50* (2013.01); *H01L 2225/06513* (2013.01); *H01L 2225/06558* (2013.01); *H01L 2225/06572* (2013.01); *H01L 2225/06589* (2013.01)

(58) Field of Classification Search
CPC . H01L 25/0657; H01L 25/043; H01L 25/071; H01L 25/0652
USPC .................................................. 257/686, 777
See application file for complete search history.

(56) References Cited

U.S. PATENT DOCUMENTS

| | | | |
|---|---|---|---|
| 7,217,994 B2 * | 5/2007 | Zhu ..................... | H01L 23/5385 257/686 |
| 8,361,842 B2 | 1/2013 | Yu et al. | |
| 8,680,647 B2 | 3/2014 | Yu et al. | |

(Continued)

*Primary Examiner* — David Vu
*Assistant Examiner* — Brandon Fox
(74) *Attorney, Agent, or Firm* — WPAT, P.C., Intellectual Property Attorneys; Anthony King

(57) ABSTRACT

A semiconductor device is disclosed. The semiconductor device includes: a first die including a signal pad region and a power pad region; a redistribution layer (RDL) over the first die; a plurality of first connectors over the RDL and at a side of the RDL opposite to the first die; a plurality of second connectors over the RDL and at the side opposite to the first die; a second die including a signal pad region and a power pad region, wherein the second die is face-to-face and electrically connected to the first die through the first connectors and the RDL, wherein a center of the second die is laterally shifted with respect to a center of the first die so as to correspond the signal pad region of the first die to the signal pad region of the second die. An associated method for fabricating the same is also disclosed.

17 Claims, 22 Drawing Sheets

(56) References Cited

U.S. PATENT DOCUMENTS

| | | |
|---|---|---|
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2011/0215470 A1* | 9/2011 | Chen ............... H01L 23/52 257/738 |
| 2011/0285005 A1* | 11/2011 | Lin ............... H01L 21/4846 257/686 |
| 2011/0291288 A1 | 12/2011 | Wu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0084441 A1* | 3/2014 | Chiu ............... H01L 23/13 257/692 |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2014/0353823 A1* | 12/2014 | Park ............... H01L 23/3128 257/737 |
| 2015/0187743 A1 | 7/2015 | Yu et al. |
| 2015/0206865 A1 | 7/2015 | Yu et al. |
| 2015/0206866 A1 | 7/2015 | Yu et al. |
| 2015/0235989 A1 | 8/2015 | Yu et al. |
| 2015/0235990 A1* | 8/2015 | Cheng ............... H01L 25/50 257/712 |
| 2015/0235993 A1 | 8/2015 | Cheng et al. |
| 2015/0364344 A1 | 12/2015 | Yu et al. |
| 2015/0364386 A1 | 12/2015 | Yu et al. |
| 2015/0364436 A1 | 12/2015 | Yu et al. |
| 2016/0260684 A1* | 9/2016 | Zhai ............... H01L 25/0652 |

* cited by examiner

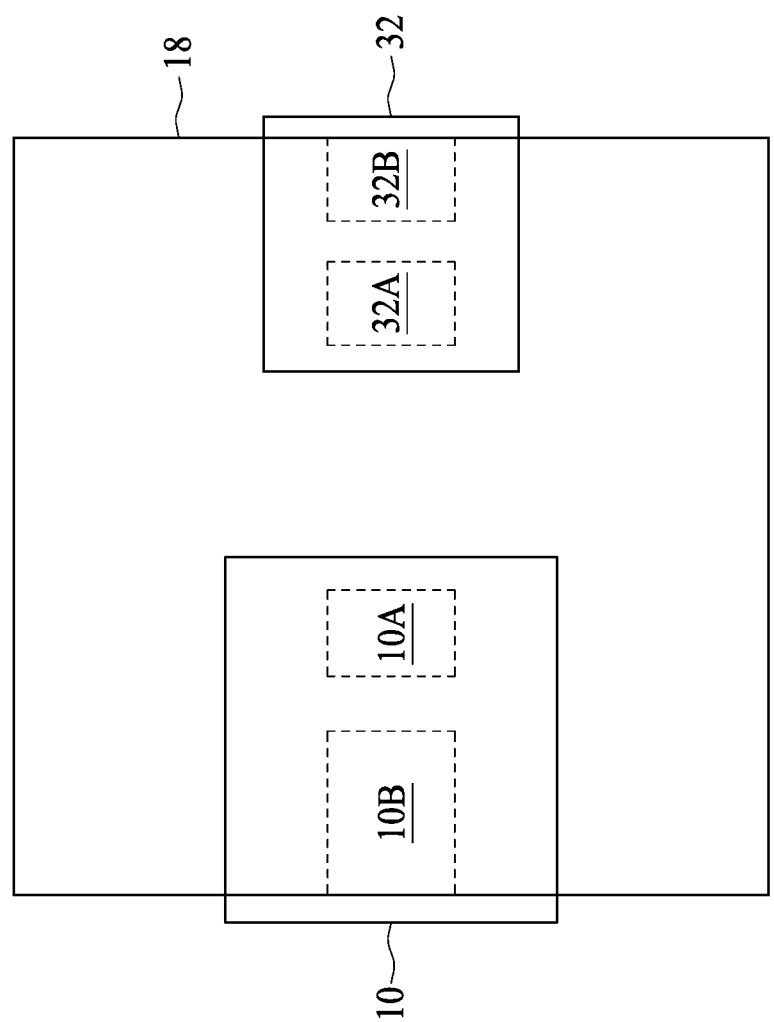

SEMICONDUCTOR STRUCTURE AND METHOD OF FABRICATING THE SAME

PRIORITY CLAIM AND CROSS-REFERENCE

This application claims the benefit of U.S. provisional application 62/305,950, filed on Mar. 9, 2016, which is incorporated by reference in its entirety.

BACKGROUND

In an aspect of integrated circuit packaging technologies, individual semiconductor dies may formed and are initially isolated. These semiconductor dies may then be bonded together, and the resulting die stack may be connected to other package components such as package substrates (e.g., interposers, printed circuit boards, and the like) using connectors on a bottom die of the die stack.

The resulting packages are known as Three-Dimensional Integrated Circuits (3DICs). Top dies of a die stack may be electrically connected to the other package components through interconnect structures (e.g., through-substrate vias (TSVs)) in bottom dies of the die stack. However, existing 3DIC packages may include numerous limitations. For example, the bonded die stack and other package components may result in a large form factor and may require complex heat dissipation features. Furthermore, existing interconnect structures (e.g., TSVs) of the bottom die may be costly to manufacture and result in long conduction paths (e.g., signal/power paths) to top dies of the die stack.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
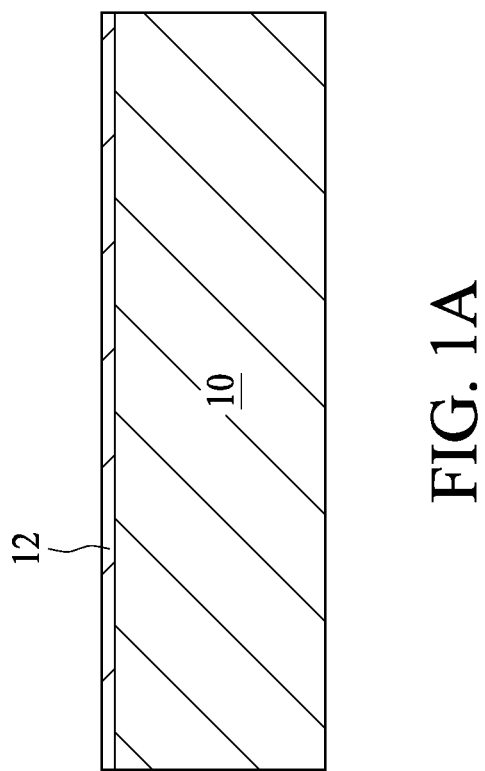
FIGS. 1A through 1S illustrate cross-sectional views of various intermediary stages of manufacturing a semiconductor package in accordance with an exemplary embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Various embodiments may include a plurality of first dies (e.g., memory dies) electrically connected to one or more second dies (e.g., logic dies) through first input/output (I/O) pads and redistribution layers (RDLs) formed on the second dies. The resulting die stack may be bonded to another package component such as an interposer, package substrate, printed circuit board, and the like through second 110 pads and the RDLs of the second dies. The package substrate may include a cavity, and the first dies may be disposed in the cavity. Thus, a three-dimensional integrated circuit (3DIC) such as a chip on fan-out package may be made with a relatively small form factor at a relatively low cost and having relatively short conduction paths (e.g., signal/power paths). Furthermore, one or more heat dissipation features may be independently formed on opposite surfaces of the first and/or second dies.

FIGS. 1A through 1L illustrate cross-sectional views of various intermediary stages of manufacturing an integrated circuit (IC) package 100 (see FIG. 1R) in accordance with various embodiments. FIG. 1A illustrates a die 10. The die 10 may include a substrate, active devices, and interconnect layers (not shown). The substrate may be a bulk silicon substrate although other semiconductor materials including group III, group IV, and group V elements may also be used. Alternatively, the substrate may be a silicon-on-insulator (SOI) substrate. Active devices such as transistors may be formed on the top surface of the substrate. Interconnect layers may be formed over the active devices and the substrate.

The interconnect layers may include an inter-layer dielectric (ILD)/inter-metal dielectric layers (IMDs) formed over the substrate. The ILD and IMDs may be formed of low-k dielectric materials having k values, for example, lower than about 4.0 or even about 2.8. In some embodiments, the ILD and IMDs comprise silicon oxide, SiCOH, and the like.

A contact layer 12 including one or more contact pads is formed over the interconnect structure and may be electrically coupled to the active devices through various metallic lines and vias in the interconnect layers. Contact pads in the contact layer 12 may be made of a metallic material such as aluminum, although other metallic materials may also be used. A passivation layer (not shown) may be formed over the contact layer 12 out of non-organic materials such as silicon oxide, un-doped silicate glass, silicon oxynitride, and the like. The passivation layer may extend over and cover edge portions of the contact pads in the contact layer 12. Openings may be formed in portions of the passivation layer that cover the contact pads, exposing at least a portion of the contact pads in the contact layer 12. The various features of the die 10 may be formed by any suitable method and are not described in further detail herein. Furthermore, the die 10 may be formed in a wafer (not shown) and singulated. Functional testing may be performed on the die 10. Thus, the die 10 in FIG. 1A may include only a known good die, which has passed one or more functional quality tests.

Figure 1B:
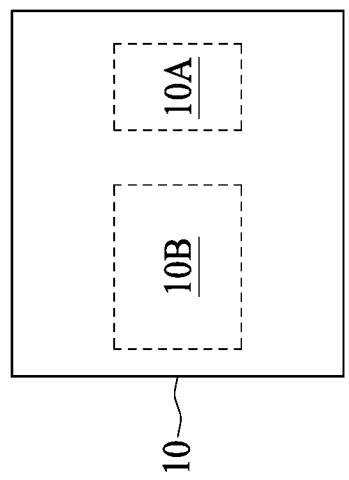

In a top down view of the die 10 (as illustrated by FIG. 1B), the die 10 may include a signal pad region 10A and a power pad region 10B on the contact layer 12. The signal pad region 10A and the power pad region 10B are coupled to associated pads of the active devices through the interconnect layers. However, the configuration of the signal pad region 10A and the power pad region 10B illustrated here is not a limitation of the present disclosure and may be different depending on design consideration.

Figure 1C:
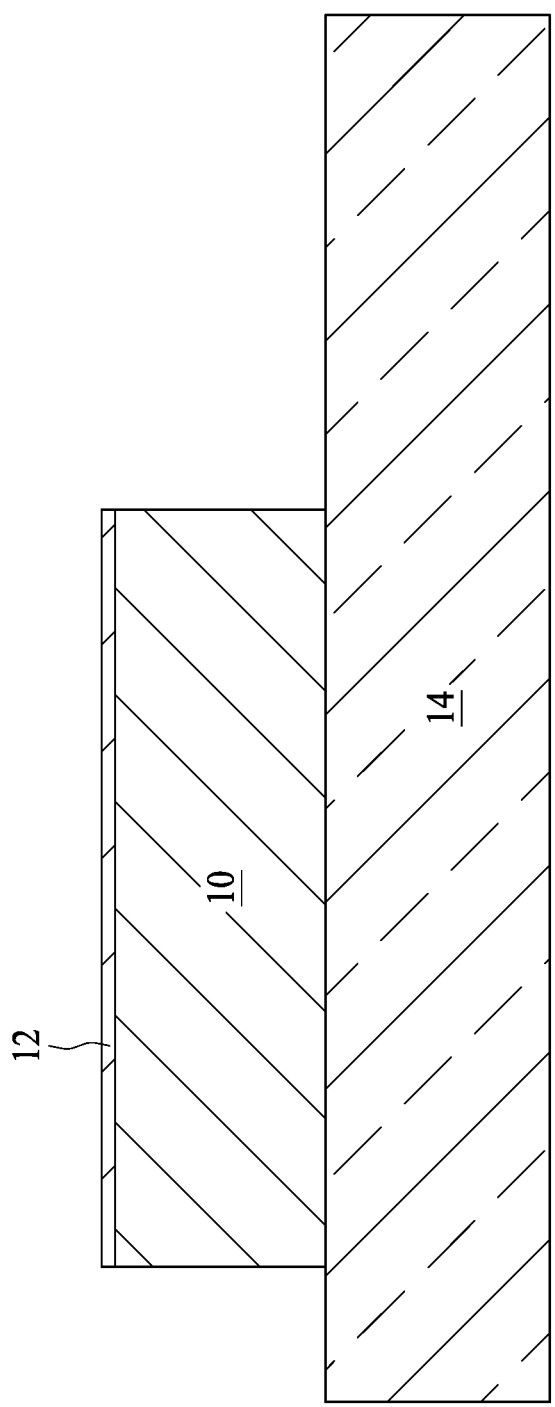

Next, referring to FIG. 1C, the die 10 may be placed on a carrier 14. The carrier 14 may be made of a suitable material, for example, glass or a carrier tape. The die 10 may be affixed to the carrier 14 through one or more adhesive layers (not shown). The adhesive layers may be formed of any temporary adhesive material such as ultraviolet (UV) tape, wax, glue, and the like. In some embodiments, the adhesive layers may further include a die attach film (DAF), which may have optionally been formed under the die 10 prior to their placement on the carrier 14. In this exemplary embodiment, instead of being placed on the center of the carrier 14, the die 10 placed on the carrier 14 is shifted from the center of the carrier 14. In particular, the die 10 is closer to one side of the carrier 14 compared to another side.

Figure 1D:
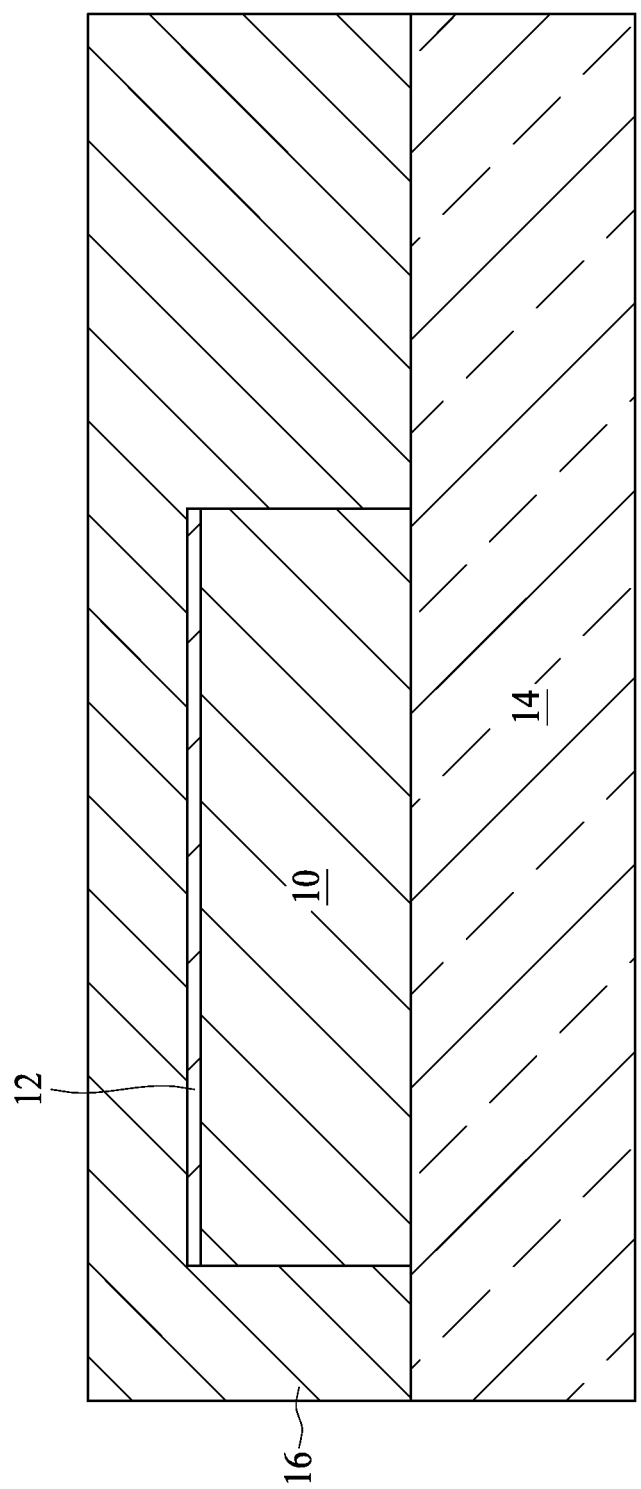

In FIG. 1D, a molding compound 16 may be formed on the carrier 14 and to cover top surfaces of the die 10. The molding compound 16 may include any suitable material such as an epoxy resin, a molding underfill, and the like. Suitable methods for forming the molding compound 16 may include compressive molding, transfer molding, liquid encapsulent molding, and the like. For example, the molding compound 16 may be dispensed on the carrier 14 in liquid form. A curing process may then be performed to solidify the molding compound 16.

Figure 1E:
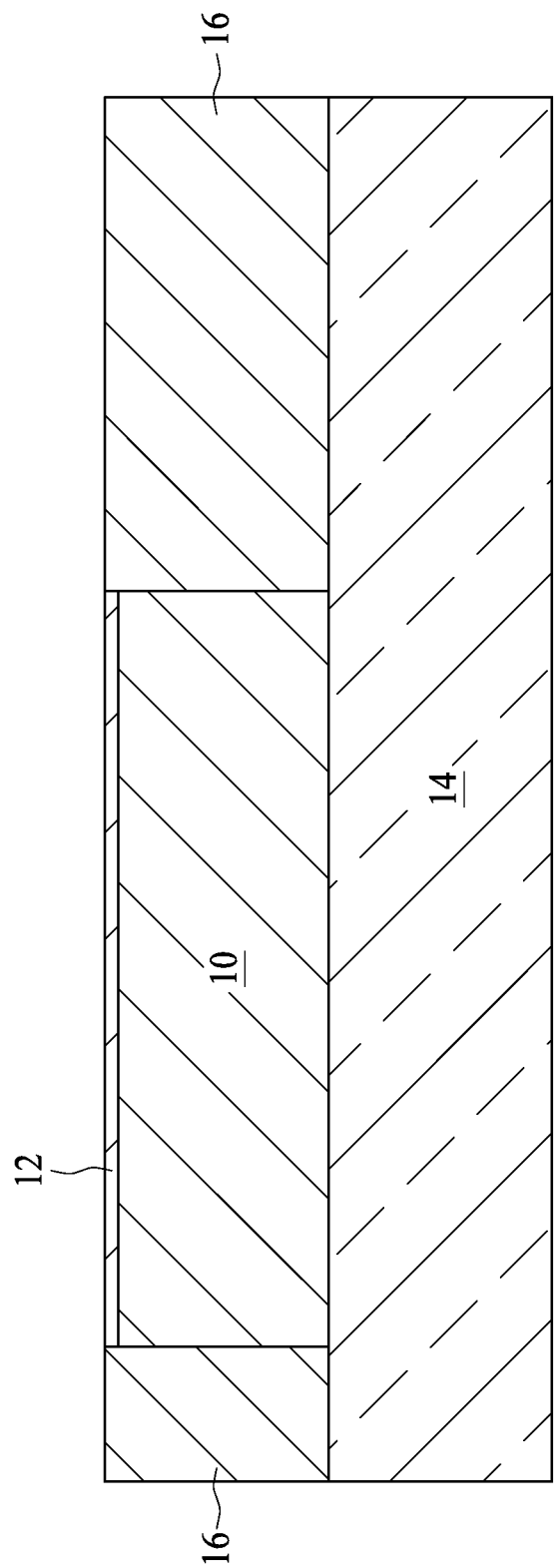

In FIG. 1E, a planarization process, such as a grinding process (e.g., a chemical-mechanical polish (CMP) or mechanical grinding) or etch back, may be performed on the molding compound 16 to expose the contact layer 12 (and any contact pads therein) on the die 10. In a top down view of the dies 10 (not shown), the molding compound 16 may encircle the die 10.

Figure 1F:
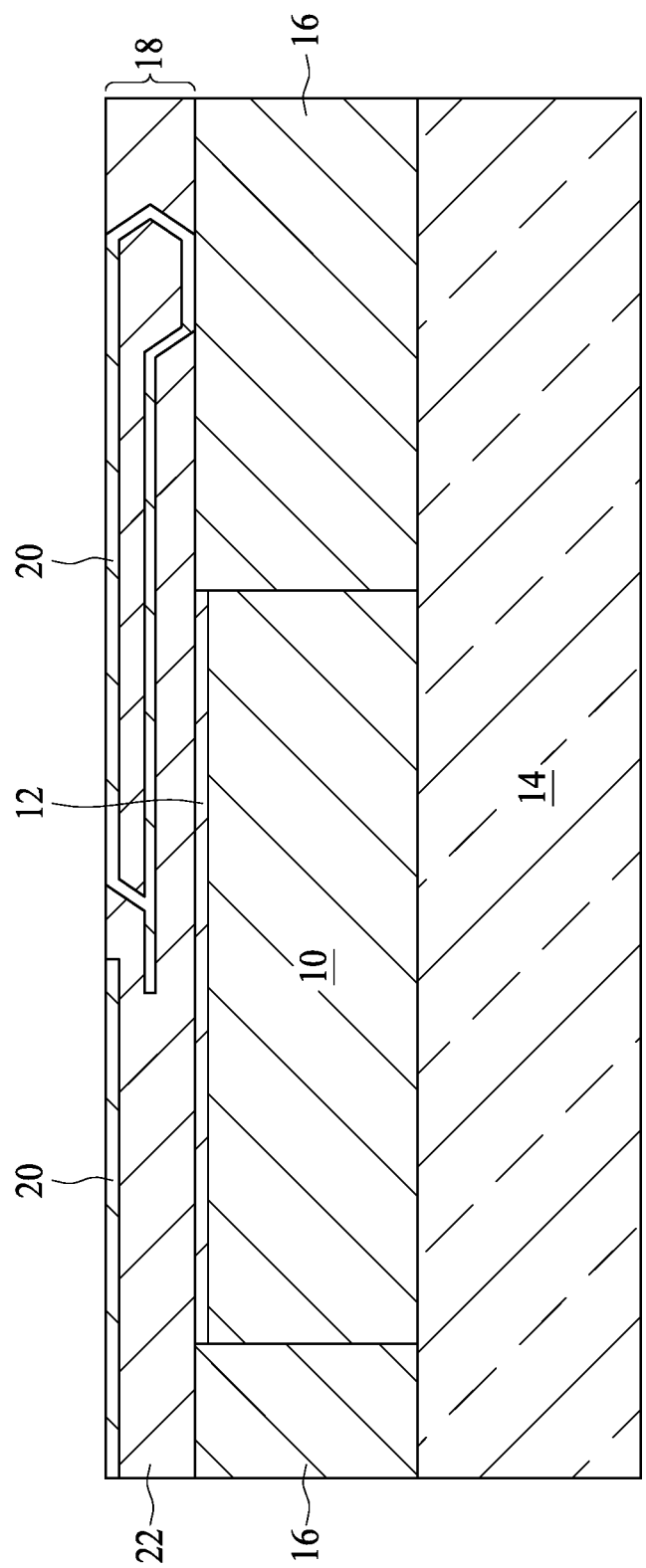

FIG. 1F illustrates the formation of redistribution layers (RDLs) 18 over the die 10 and the molding compound 16. As illustrated by FIG. 1F, the RDLs 18 may extend laterally past edges of the die 10 over the molding compound 16. The RDLs 18 may include interconnect structures 20 formed in one or more polymer layers 22. The polymer layers 22 may be formed of any suitable material (e.g., polyimide (PI), polybenzoxazole (PBO), benzocyclobuten (BCB), epoxy, silicone, acrylates, nano-filled pheno resin, siloxane, a fluorinated polymer, polynorbomene, and the like) using any suitable method, such as, a spin-on coating technique, and the like.

The interconnect structures 20 (e.g., conductive lines and/or vias) may be formed in the polymer layers 22 and electrically connected to the contact layer 12 of the die 10. The formation of the interconnect structures 20 may include the patterning polymer layers 22 (e.g., using a combination of photolithography and etching processes) and forming the interconnect structures 20 (e.g., depositing a seed layer and using a mask layer to define the shape of the interconnect structures 20) in the patterned polymer layers 22. The interconnect structures 20 may be formed of copper or a copper alloy although other metals such as aluminum, gold, and the like may also be used. The interconnect structures 20 may be electrically connected to the contact pads in the contact layer 12 (and as a result, active devices) in the die 10.

Figure 1G:
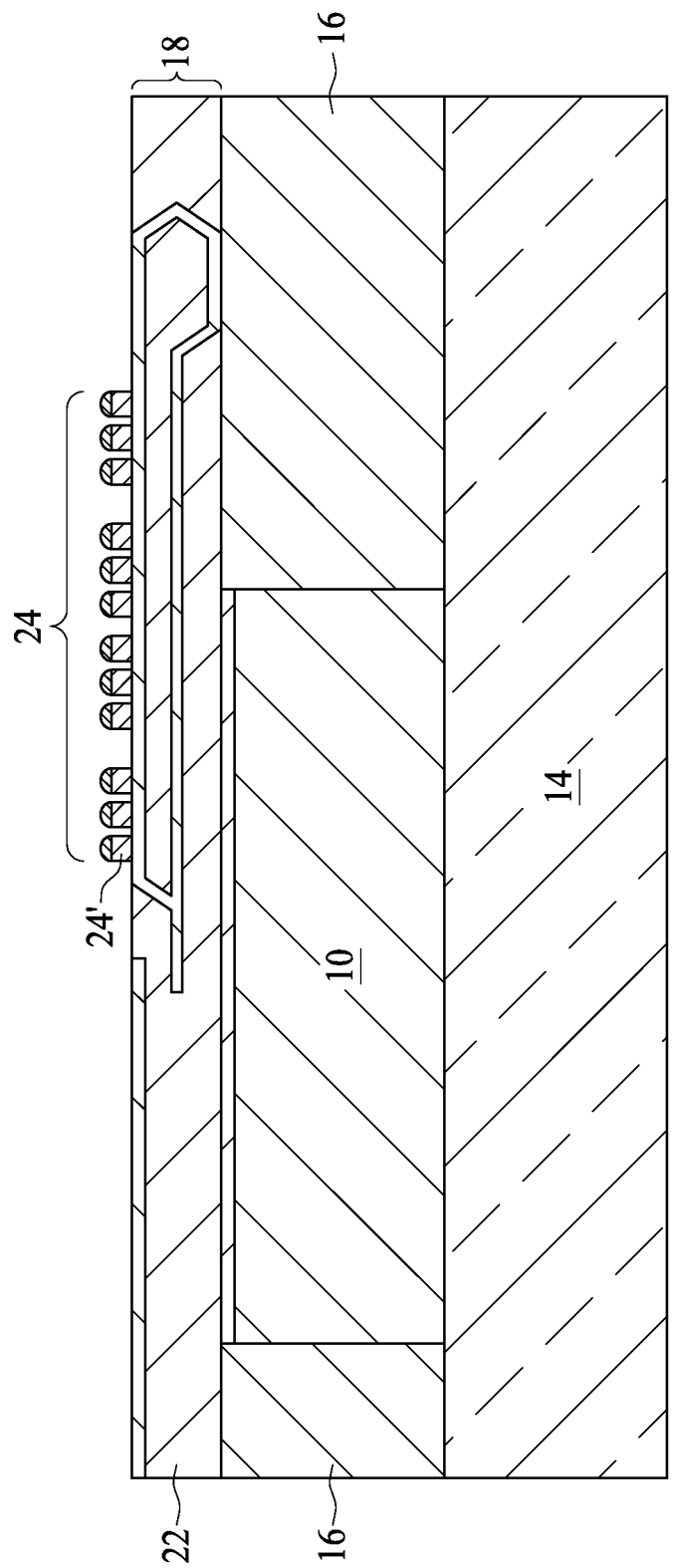
Figure 1H:
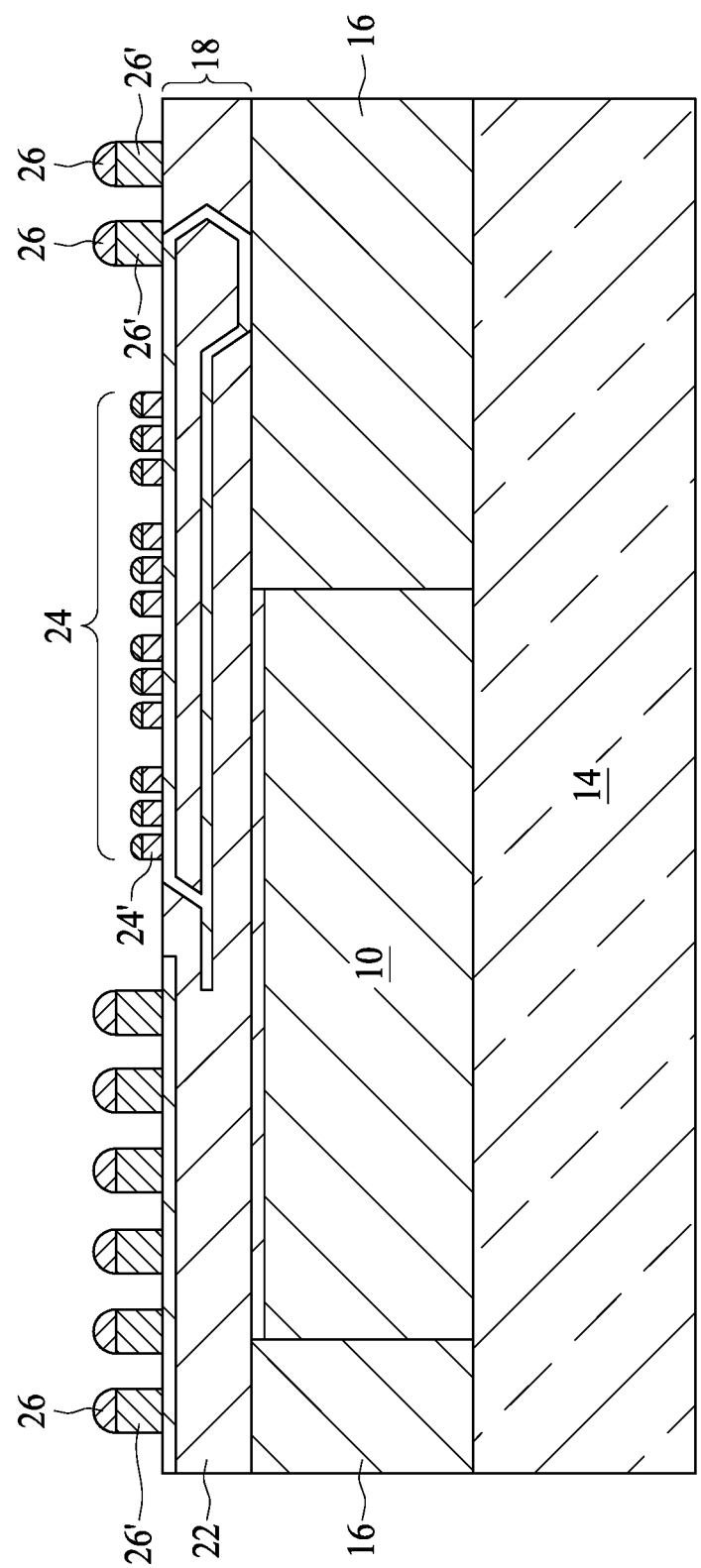

FIGS. 1G and 1H illustrate the formation of connectors 24 and 26 over the RDLs 18. Notably, the connectors 24 and 26 are formed on a same side of the die 10 (i.e., on a same surface of the RDLs 18). The connectors 24 and 26 may be formed of any suitable material (e.g., copper, solder, and the like) using any suitable method. In some embodiments, the formation of the connectors 24 and 26 may first include the formation of under bump metallurgies (UBMs) 24'/26' electrically connected to active devices in the die 10 through the RDLs 18. The connectors 24 and 26 may extend laterally past edges of the die 10, forming fan-out interconnect structures. The inclusion of the RDLs 18 may increase the number of the connectors 24 and 26 (e.g., input/output pads) connected to the die 10. The increased number of the connectors 24 and 26 may allow for increased bandwidth, increased processing speed (e.g., due to shorter signaling paths), lower power consumption (e.g., due to shorter power conduction paths), and the like in subsequently formed IC packages (e.g., the package 100 of FIG. 1R). In the exemplary embodiment, a portion of the connectors 24 extends laterally past edges of the die 10 and the remaining portion of the connectors 24 is directly above the die 10. Similarly, a portion of the connectors 26 extends laterally past edges of the die 10 and the remaining portion of the connectors 26 is directly above the die 10.

Furthermore, the connectors 24 and 26 may vary in size. For example, the connectors 24 may be microbumps having a pitch of about 40 µm or more while the connectors 26 may be controlled collapse chip connection (C4) bumps having a pitch of about 140 µm to about 150 µm. In alternative embodiments, the connectors 24 and 26 may include different dimensions. Thus, as illustrated by FIGS. 1G and 1H, the connectors 24 may be formed prior to the connectors 26 to allow for the size differences.

The differing sizes of the connectors 24 and 26 may allow different electrical devices (e.g., having differently sized connectors) to be bonded to the die 10. For example, the connectors 24 may be used to electrically connect the die 10 to another die 32 (see FIG. 1I), and the connectors 26 may be used to electrically connect the die 10 to a package substrate (e.g., a printed circuit board, interposer, and the like, as will be discussed later). Furthermore, because the connectors 24 and 26 are formed on a same side of the die 10, different electrical devices may also be bonded to a same side of the die 10. Although a particular configuration of the die 10 and the RDLs 18 is illustrated, alternative configurations may be applied (e.g., having a different number of the RDLs 18 and/or the connectors 24/26) in alternative embodiments. In the exemplary embodiment, the die 10 has a greater die size than the die 32.

Figure 1I:
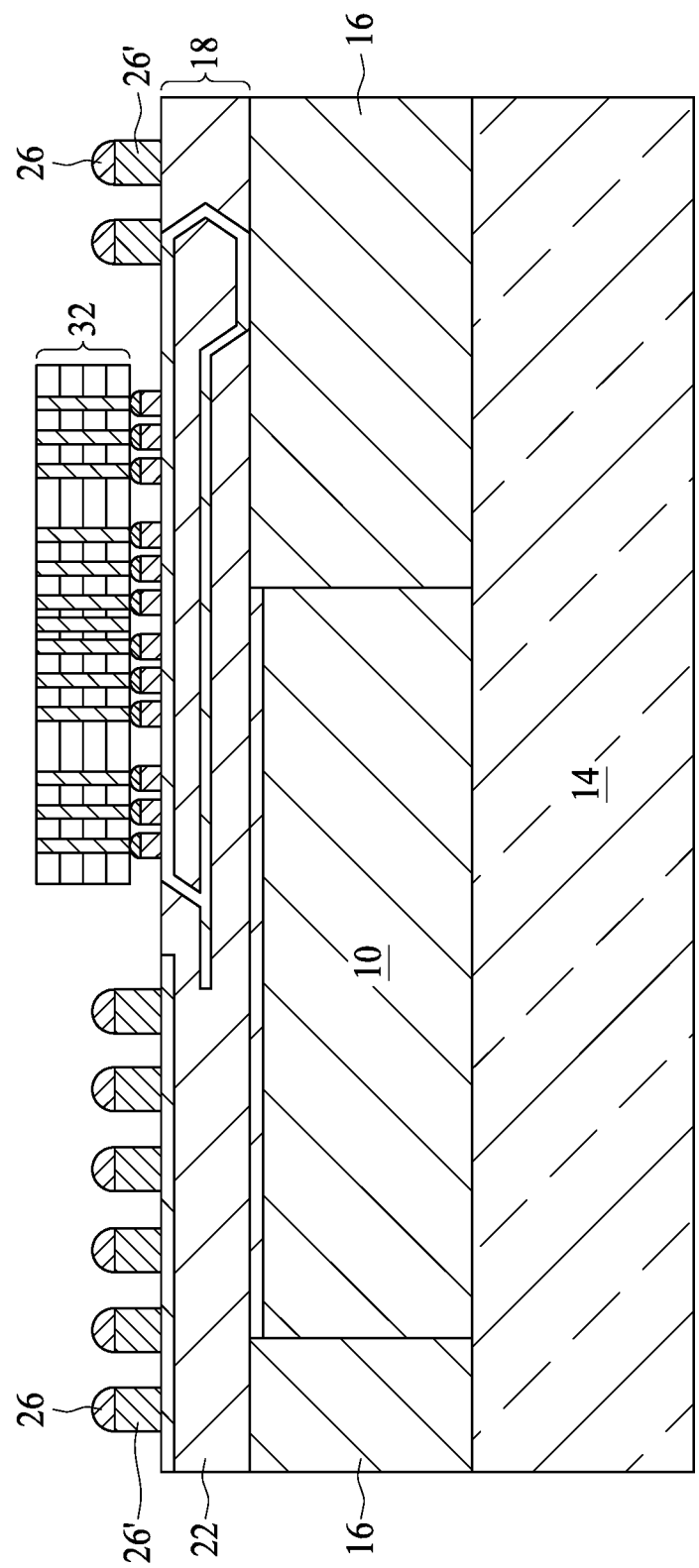
Figure 1J:
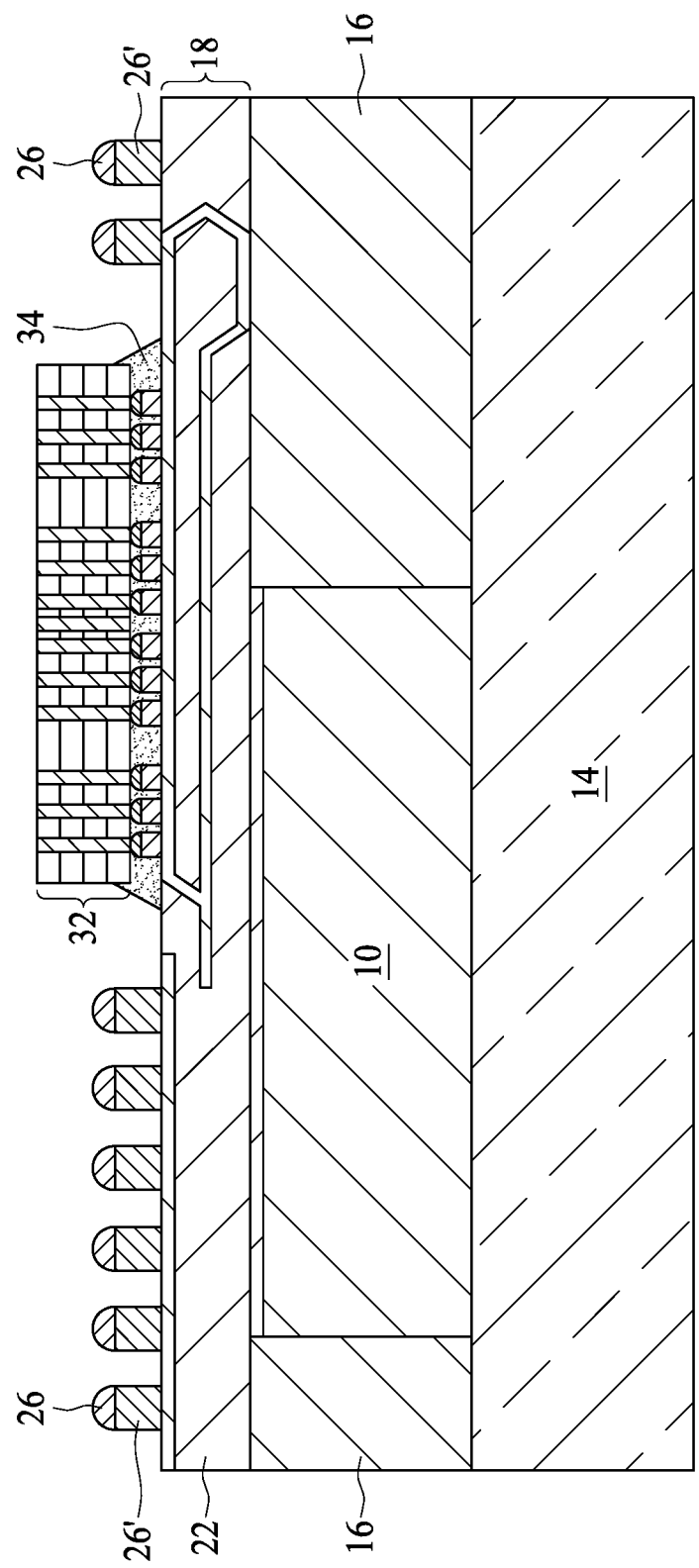

In FIG. 1I, the die 32 may be bonded to the die 10 face-to-face through the connectors 24 (e.g., by reflowing the connectors 24) to form a die stack 10/32. The die 32 may be electrically connected to active devices in the die 10 through the RDLs 18. In some embodiments, the die 32 may be a memory die (e.g., a high bandwidth memory (HBM) die) bonded to the die 10, which may be a logic die providing control functionality for the memory die 32. In alternative embodiments, other types of dies may be included in the die stack 10/32. Next, as illustrated in FIG. 1J, underfill 34 may be dispensed between the die 32 and the RDLs 18 around the connectors 24. The underfill 34 may provide support for the connectors 24.

Figure 1K:
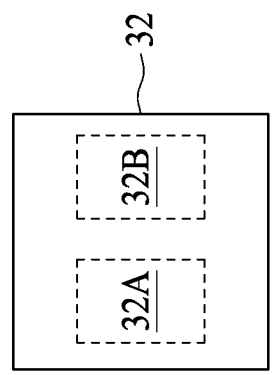

In a top down view of the die 32 (as illustrated by FIG. 1K), the die 32 may include a signal pad region 32A and a power pad region 32B on the die 32. The signal pad region 32A and the power pad region 32B are coupled to associated pads of the active devices through interconnect layers. However, the configuration of the signal pad region 32A and the power pad region 32B illustrated here is not a limitation of the present disclosure and may be different depending on design consideration.

Figure 1L:
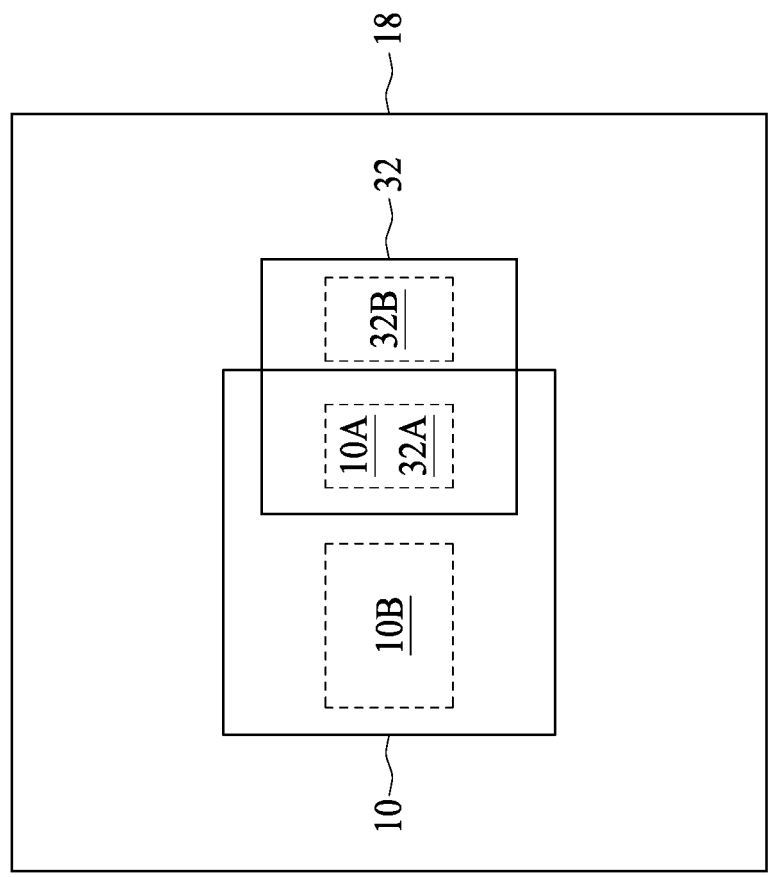
Figure 1N:
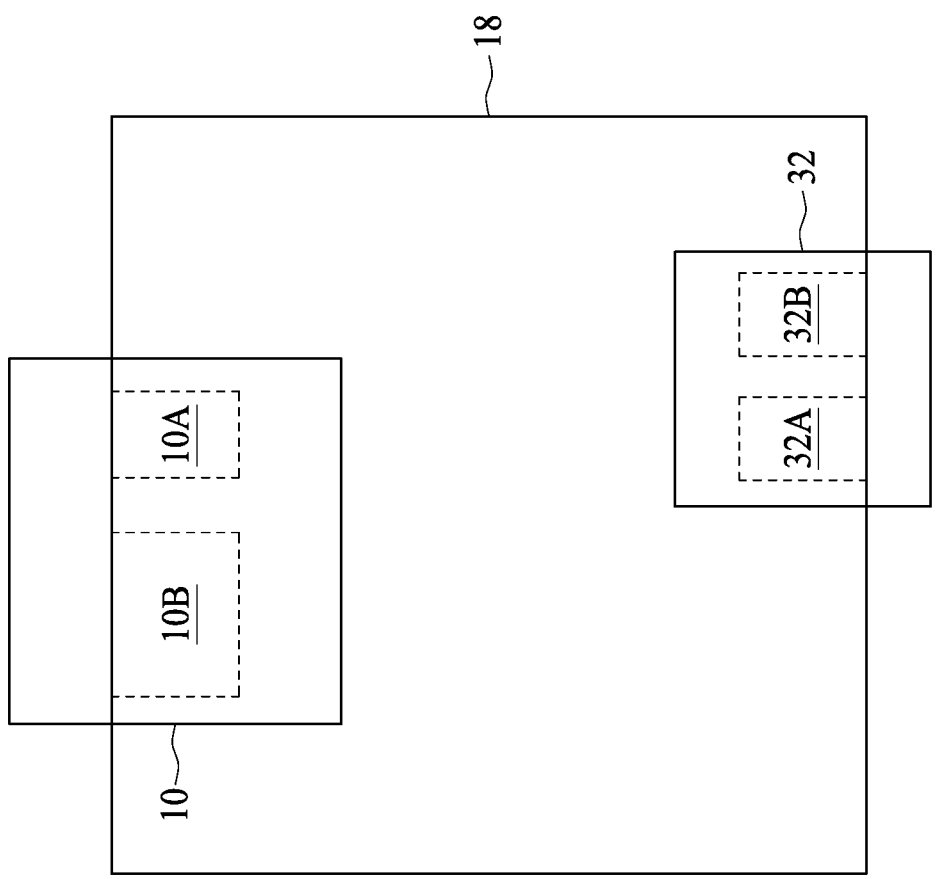
Figure 10:
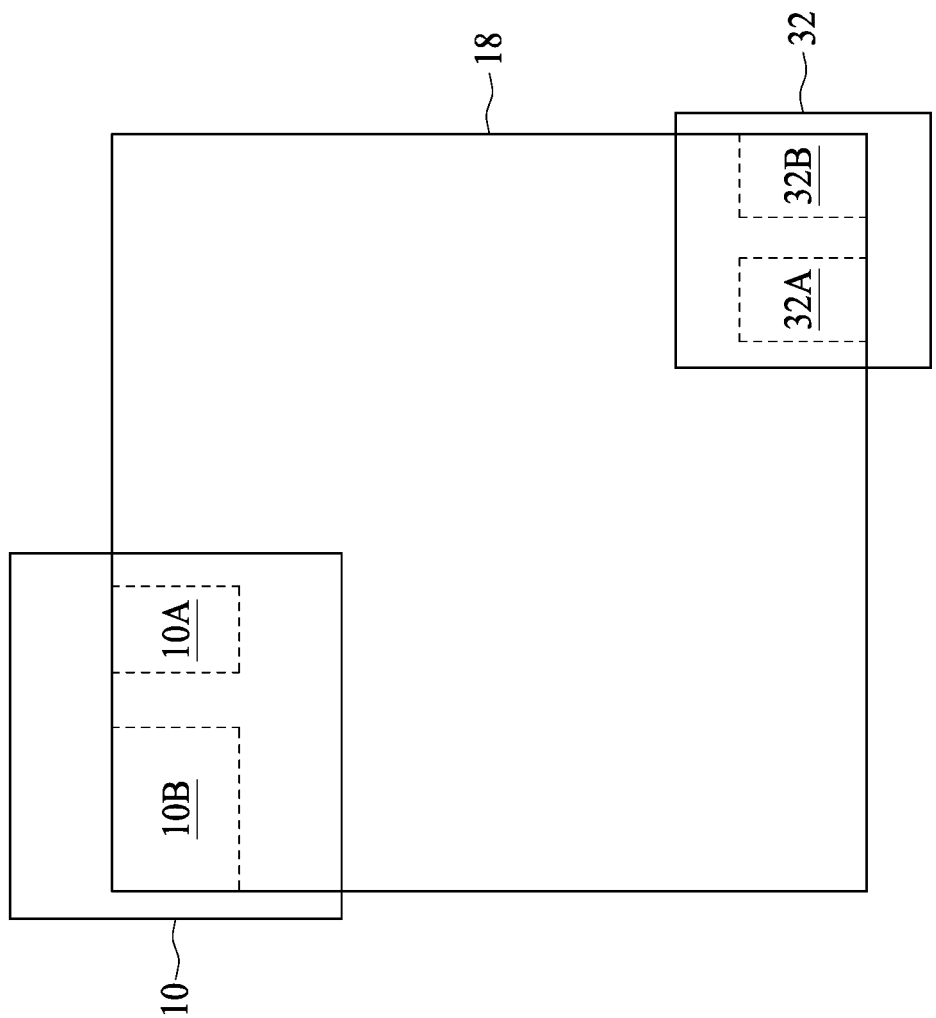

In a top down view of the dies 10, 32 and the RDLs 18 (as illustrated by FIG. 1L), it can be seen that the die 32 may be disposed to extend over the die 10 so as to allow the signal pad region 32A at least cover partly the signal pad region 10A. Comparing to the existing die stacking methods, the embodiment provides a die stacking method with shifted die placement. In that way, the signal pad region 32A can be closer to the signal pad region 10A. The signal pads of the die 32 can be coupled to the corresponding pads of the die 10 via a shorter connection path with less or even without addition lateral routings in the RDLs 18. In the exemplary embodiment, pads of the pad region 10A may be particularly arranged to map the location of the corresponding pads of the pad region 32A in order to achieve shorter connection paths between the pads of the pad region 10A and the pads of the pad region 32A. In some embodiments, the die 32 can be shifted even more in each lateral direction as illustrated in FIGS. 1M-1O, wherein the edges of the dies 10 and 32 may laterally past edges of the RDLs 18. These embodiments are all fall within the scope of the present disclosure as long as the signal pad regions 10A, 32A, the power pad regions 10B and 32B are placed in the range of the RDLs 18.

Figure 1P:
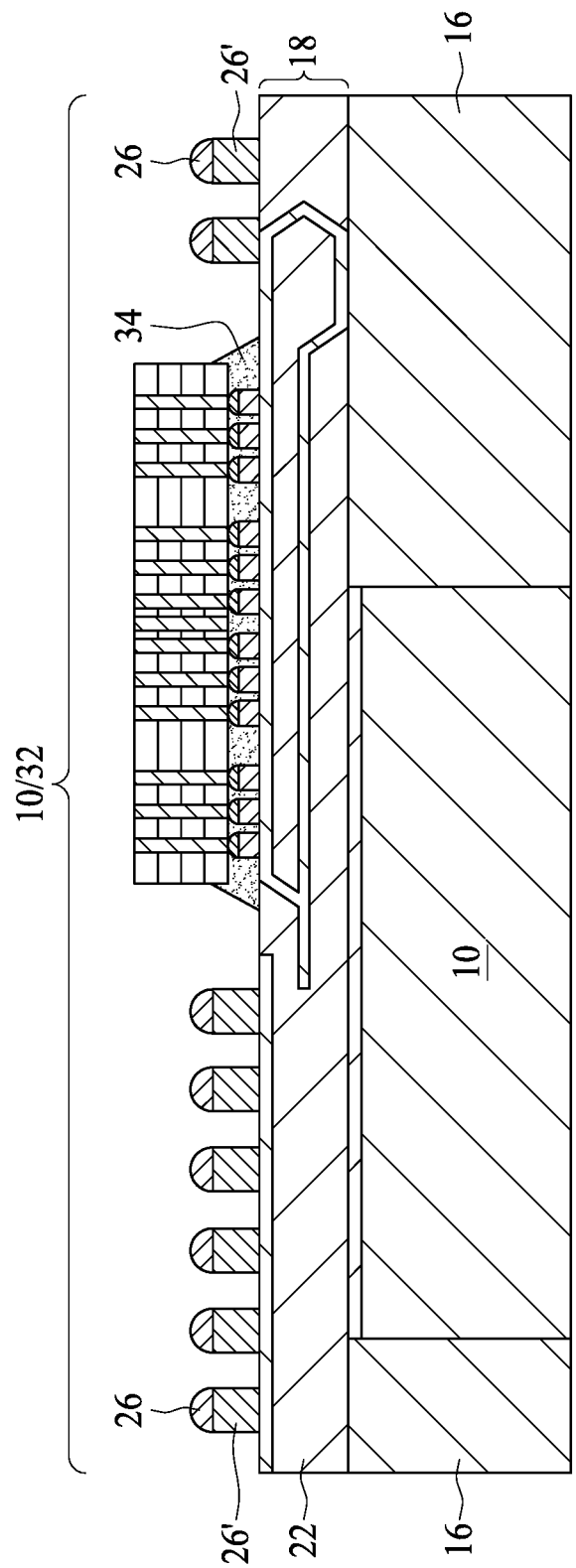

FIG. 1P illustrates the removal of the carrier 14 from the die stack 10/32 using any suitable method. For example, in an embodiment in which the adhesive between the die 10 and the carrier 14 is formed of UV tape, the die 10 may be removed by exposing the adhesive layer to UV light. Subsequently, the die stack 10/32 may be singulated for packaging in an IC package. The singulation of the die stack 10/32 may include the use of a suitable pick-and-place tool.

Figure 1Q:
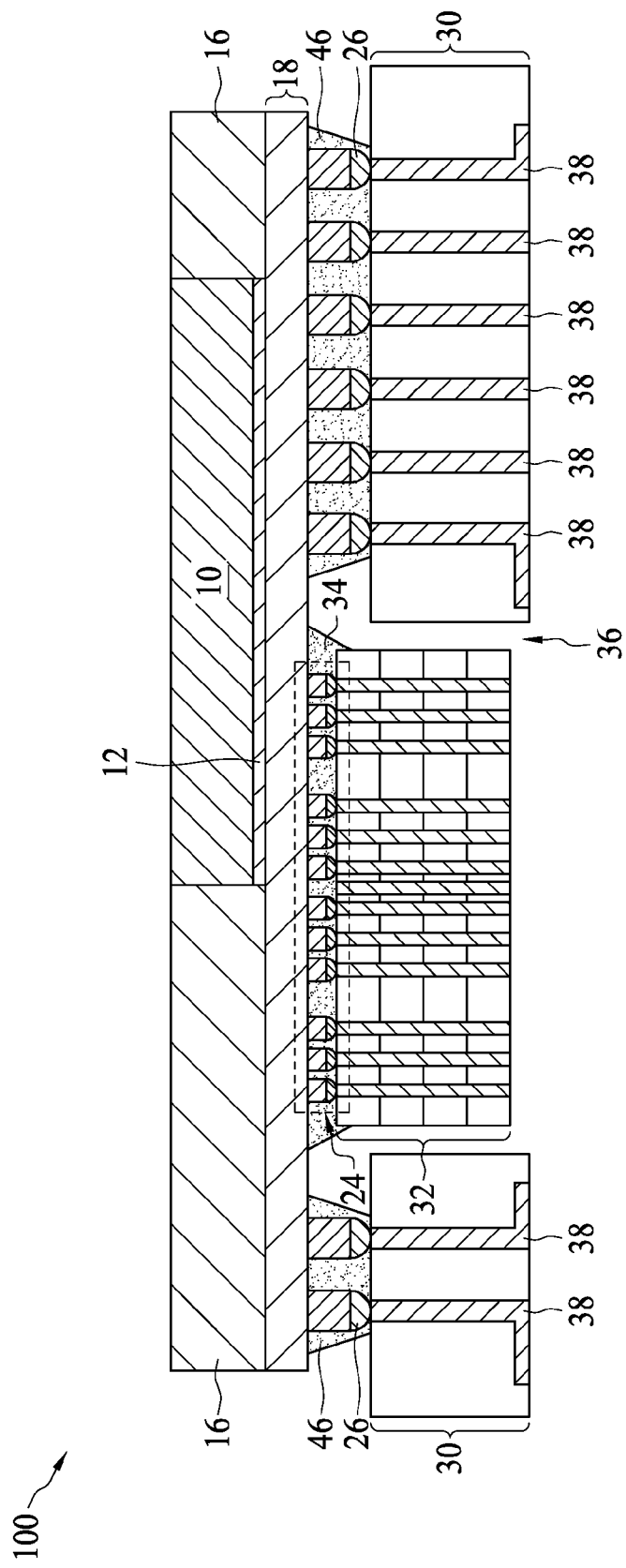

Next, as illustrated by FIG. 1Q, the die stack 10/32 may be bonded to a package substrate 30 through the connectors 26. A reflow may be performed on the connectors 26 to bond the die stack 10/32 to the package substrate 30. As illustrated by FIG. 1Q, an underfill 46 maybe dispensed between the die stack 10/32 and the package substrate 30 around the connectors 26. The underfill 46 may be substantially similar to the underfill 34. The package substrate 30 may be an interposer as illustrated in the exemplary embodiment.

Furthermore, the package substrate 30 may include a through hole 36, which may be forming in the package substrate 30 using an suitable method. For example, the through hole 36 may be formed using a laser drilling process. The configuration of the package substrate 30 may be designed so that active interconnect structures 38 (e.g., power, ground, and/or signal layers) may be routed to avoid the through hole 36. Thus, the through hole 36 may not substantially interfere with the functionality of the package substrate 30.

When the die stack 10/32 is bonded to the package substrate 30, the die 32 may be disposed, at least partially, in the through hole 36. Thus, the bonded structure may advantageously have a relatively small form factor and higher bandwidth. Furthermore, the die 32 may be electrically connected to the package substrate 30 through the RDLs 18 and the connectors 24/26. In some embodiments, the die 10 may include fewer or be substantially free of through-substrate vias (TSVs) for electrically connecting the die 32 to the package substrate 30. The reduced number of TSVs may lower the cost of manufacturing the die 10.

Figure 1R:
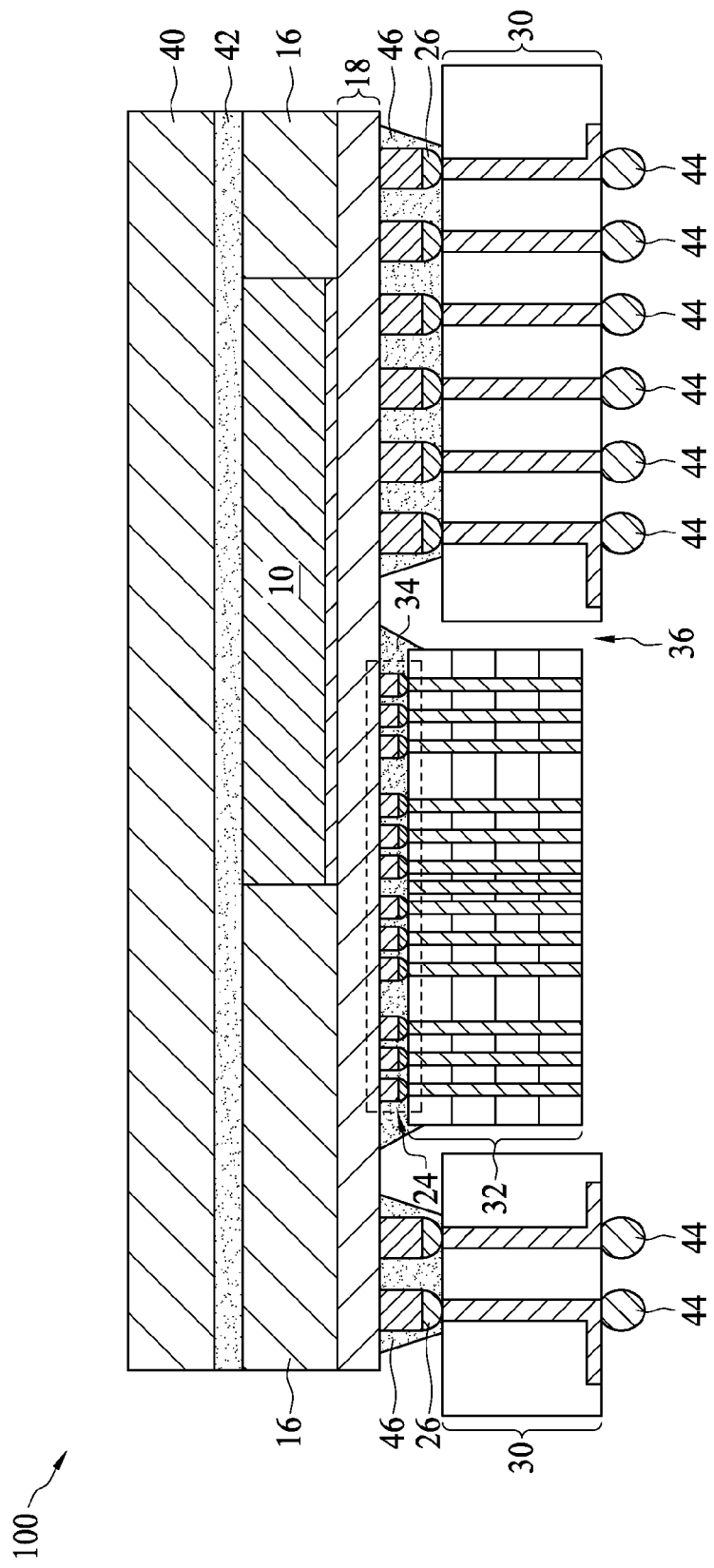

Next, referring to FIG. 1R, a heat dissipation feature 40 may be disposed over the die 10. The heat dissipation feature 40 may be disposed on a surface of the die 10 opposite the RDLs 18, the connectors 24, and the die 32. The heat dissipation feature 40 may be a contour lid having a high thermal conductivity, for example, between about 200 watts per meter kelvin (W/m·K) to about 400 W/m·K or more, and may be formed using a metal, a metal alloy, and the like. For example, the heat dissipation feature 40 may comprise metals and/or metal alloys such as Al, Cu, Ni, Co, combinations thereof, and the like. The heat dissipation feature 40 may also be formed of a composite material, for example silicon carbide, aluminum nitride, graphite, and the like. In some embodiments, the heat dissipation feature 40 may also extend over surfaces of the molding compound 16.

Interfacing material 42 may be disposed between the heat dissipation features 40 and the die 10/the molding compound 16. The interfacing material 42 may include a thermal interface material (TIM), for example, a polymer having a good thermal conductivity, which may be between about 3 watts per meter kelvin (W/m·K) to about 5 W/m·K or more. Because the TIM may have good thermal conductivity, the TIM may be disposed directly between (e.g., contacting) the die 10 and the heat dissipation feature 40. Furthermore, the interfacing material 42 may also include an adhesive (e.g., an epoxy, silicon resin, and the like) for affixing the heat dissipation lid 40 to the die 10/the molding compound 16. The adhesive used may have a better adhering ability and a lower thermal conductivity than a TIM. For example, the adhesive used may have a thermal conductivity lower than about 0.5 W/m·K. As such, the adhesive portions of the interfacing material 42 may be disposed over areas having lower thermal dissipation needs (e.g., over surfaces of the molding compound 16).

After the attachment of the heat dissipation feature 40, a marking process (e.g., laser marking) may be performed to mark the package 100. Furthermore, as illustrated by FIG. 1R, connectors 44 (e.g., ball grid array (BGA) balls) disposed on a surface of the package substrate 30 opposite the connectors 26 and the die 10. The connectors 44 may be used to electrically connect the package 100 to a motherboard (not shown) or another device component of an electrical system.

Figure 1S:
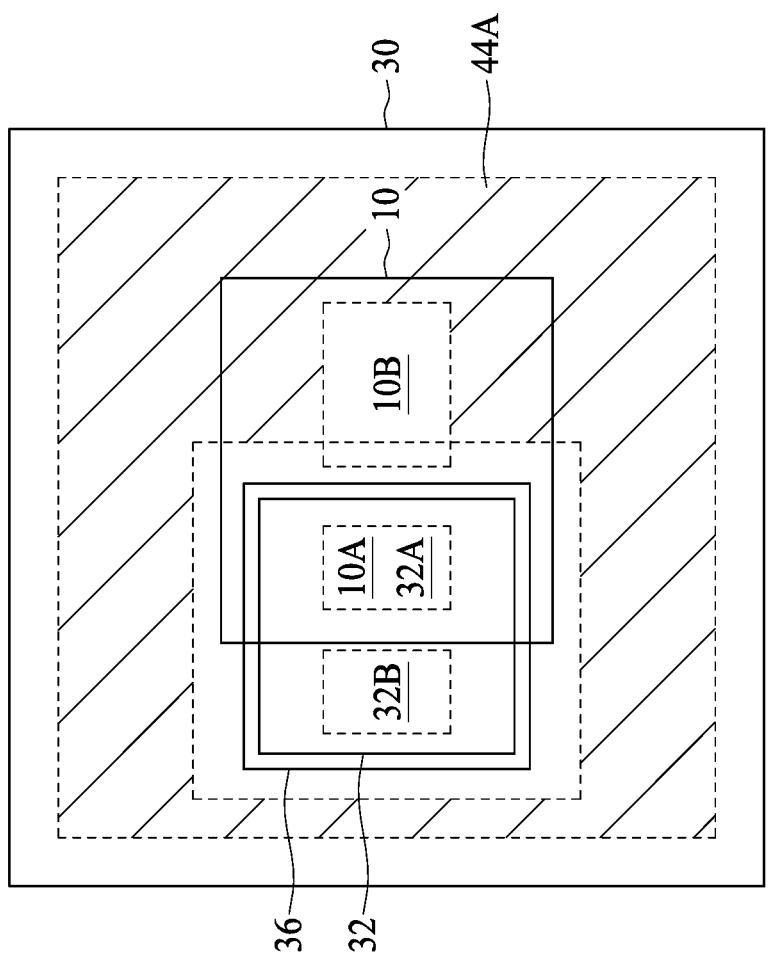

In a top down view of the package 100 (as illustrated by FIG. 1S), the package substrate 30 may encircle the die stack 10/32. The die 32 may be disposed in the through hole 36. Instead of being placed at the center of the substrate 30, the through-hole 36 may be disposed closer to one side of the package substrate 30 compared with another side. As such, the overall connectors 44 may be disposed as an asymmetric square ring 44A as shown in FIG. 1S. For example, the left side of the asymmetric square ring 44A may include two columns of the connectors 44, and the right side of the asymmetric square ring 44A may include six columns of the connectors 44.

Figure 2:
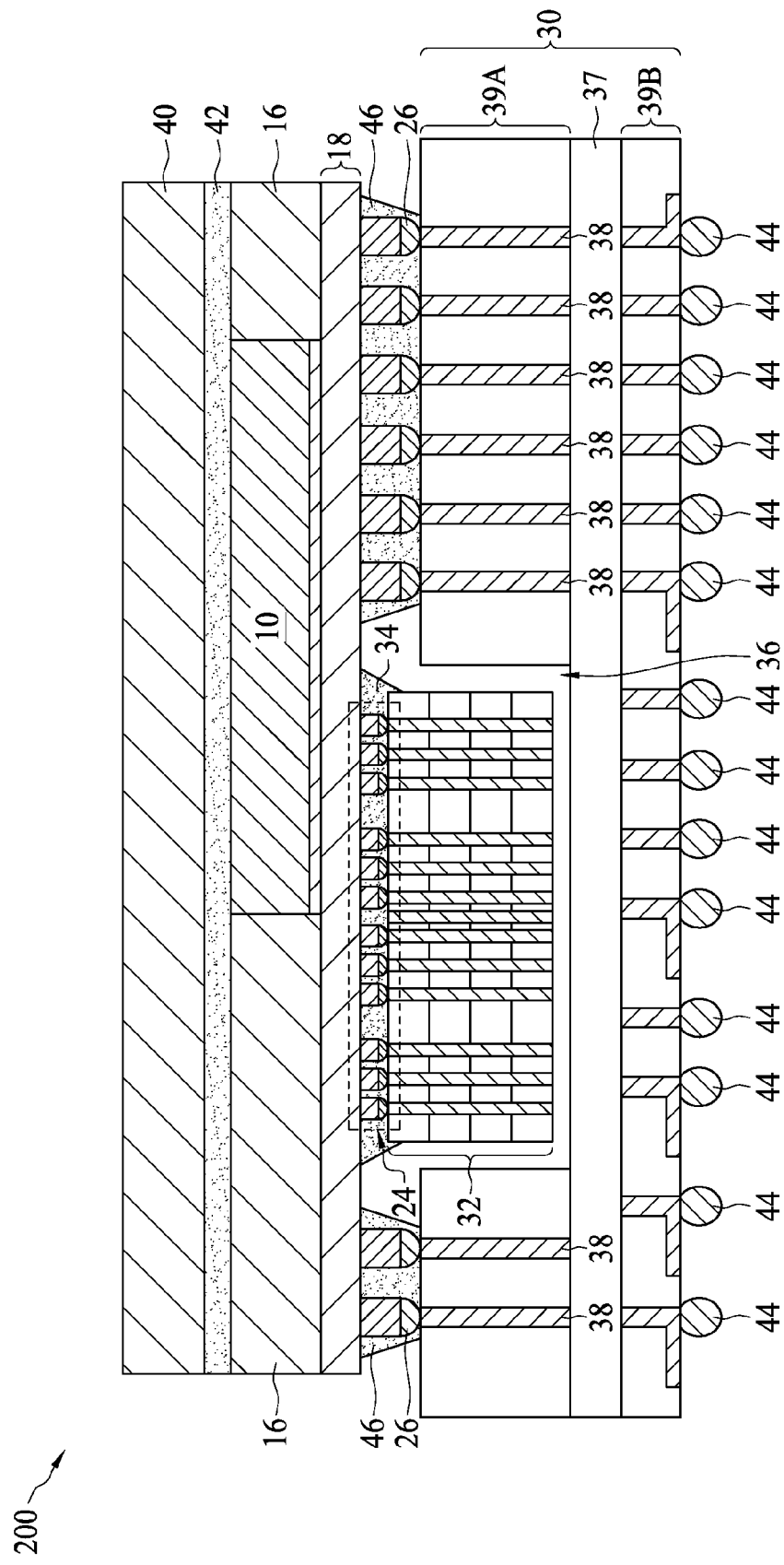
FIG. 2 illustrates a cross-sectional view a semiconductor package in accordance with another embodiment of the present disclosure.
Figure 3:
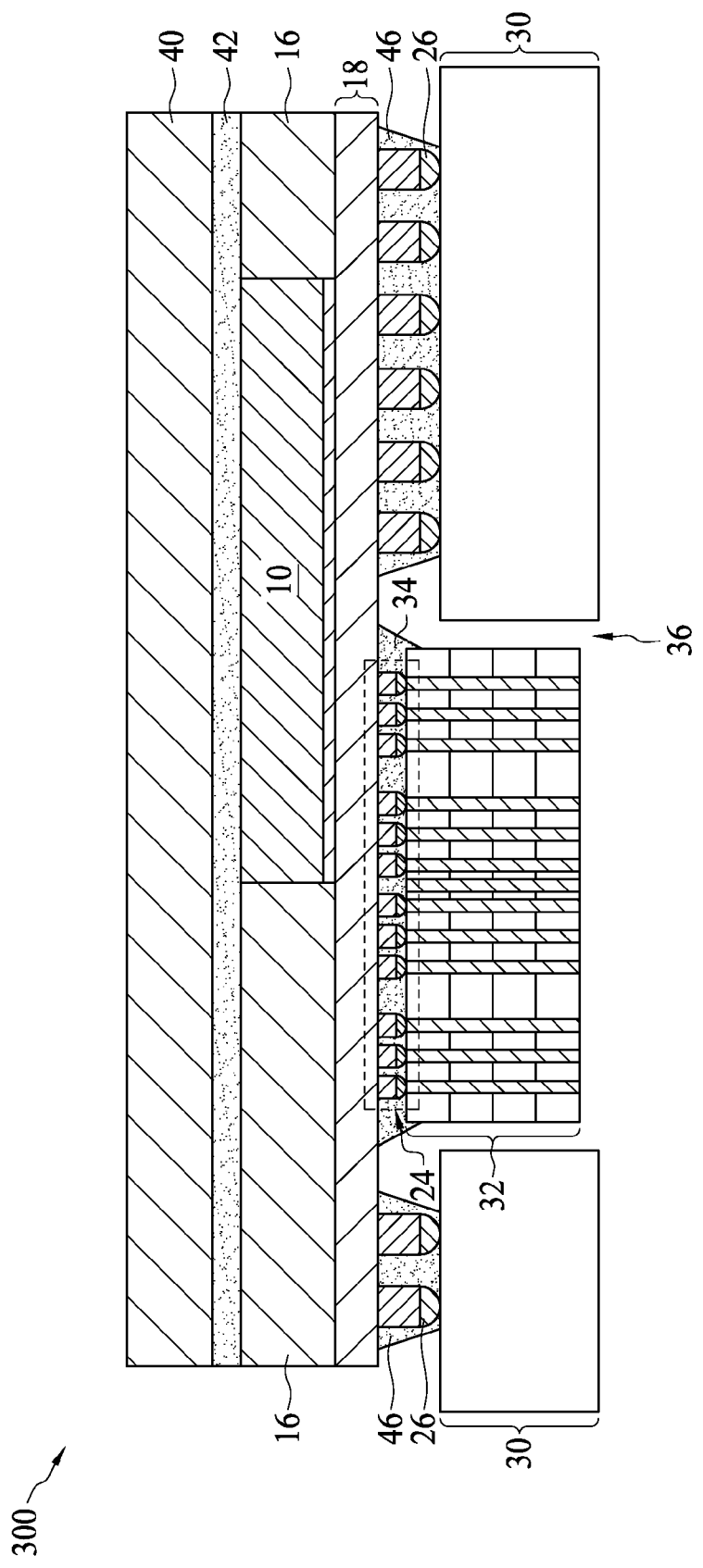
FIG. 3 illustrates a cross-sectional view a semiconductor package in accordance with still another embodiment of the present disclosure.

The package substrate 30 may be an interposer, a printed circuit board (PCB), and the like. For example, FIG. 2 illustrates a package 200 according to another embodiment of the present disclosure. The package substrate 30 of the package 200 further includes a core 37 and one or more build-up layers labeled 39A and 39B disposed on either side of core 37. Interconnect structures 38 (e.g., conductive lines, vias, and/or through vias) may be included in the package substrate 30 to provide functional electrical purposes such as power, ground, and/or signal layers. The package substrate 30 includes a recess 36' in the build-up layer 39A facing the die 10. The die 32 is at least partially received by the recess 36'. FIG. 3 illustrates a package 300 according to still another embodiment of the present disclosure. The package substrate 30 of the package 300 is a PCB, and connectors 26 may be BGA balls.

Figure 4:
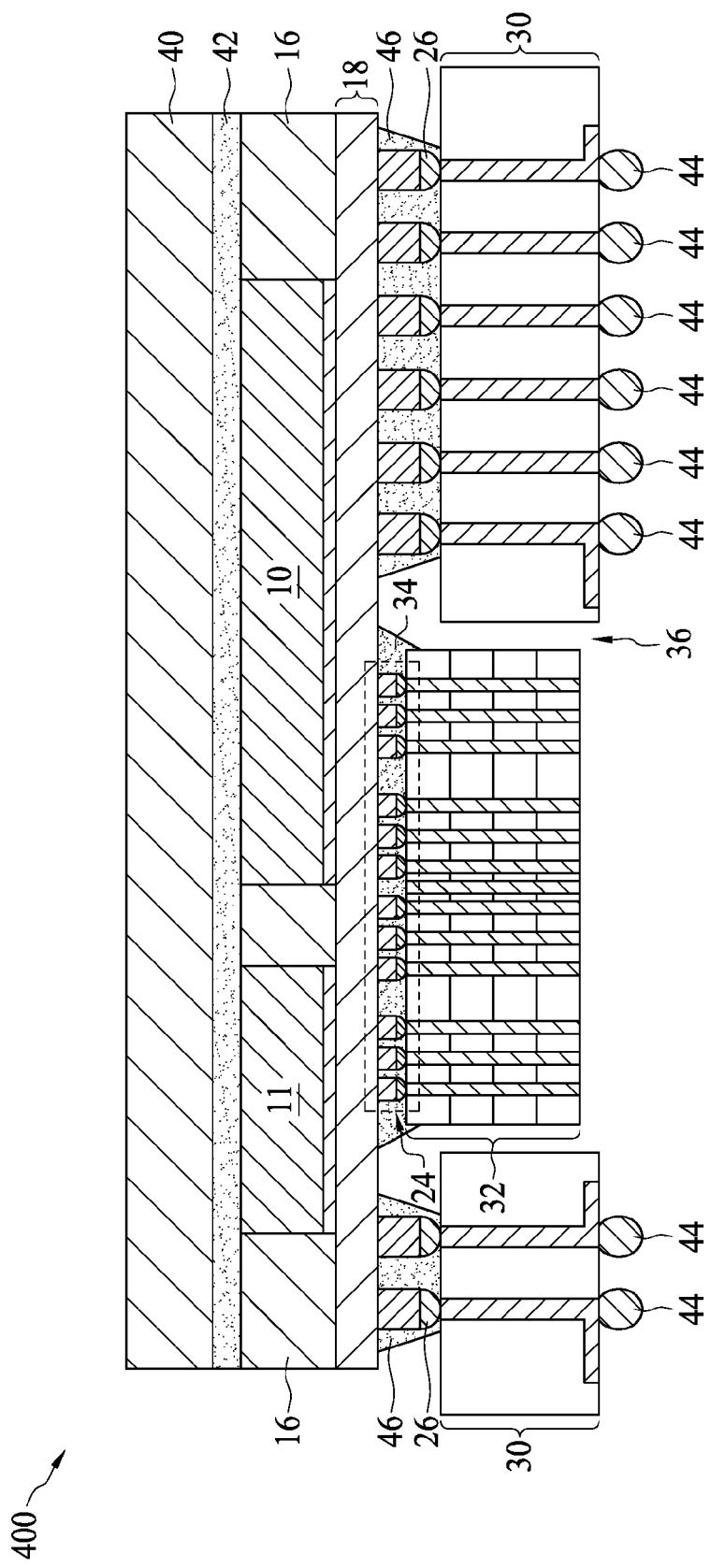
FIG. 4 illustrates a cross-sectional view a semiconductor package in accordance with still yet another embodiment of the present disclosure.

FIG. 4 illustrates a cross-sectional view of the semiconductor package 400, respectively. The package 400 may be substantially similar to the package 100 where like reference numerals represent like elements. However, the package 400 may further include another die 11. The dies 10 and 11 may be part of a same fan-out package. For example, the dies 10 and 11 may be disposed side-by-side and surrounded by the molding compound 16, and the RDLs 18 may be formed on a surface of the dies 10 and 11. In the embodiment, the die 10 may include complex functions, and the die 11 may include a power related function. For example, the die 10 may be a system-on-chip (SoC) IC, and the die 11 may be an integrate voltage regulator (IVR) IC or a power management IC. The RDLs 18 may electrically connect dies 10 and 11.

In the embodiment, at least a portion of signal pads of the signal pad region 10A of the die 10 is electrically connected to at least a portion of signal pads of the signal pad region 32A of the die 32 through the RDLs 18. At least a portion of the remaining pads of the die 10 may be electrically connected to outside devices through the RDLs 18 and the connectors 44. At least a portion of pads of the die 11 may be electrically connected to outside devices through the RDLs 18 and the connectors 44. In some embodiments, the die 11 may also be electrically connected to the die 32 through the RDLs 18. Furthermore, dies 10 and 11 may be substantially level. The formation of dies 10 and 11 may be substantially similar to the process illustrated in FIGS. 1A through 1S although singulation may be performed at different locations (e.g., scribe lines for a pick and place tool may be configured at different locations).

Thus, as described above, a package substrate may include a cavity shifted from the center of the package substrate. A first die may be bonded to the package substrate. Where the cavity may be on the same side of the package substrate as the first die or on an opposing side of the package substrate as the first die. A second die may be bonded to the first die wherein the center of the second die is shifted from the center of the first die, and the second dies may be disposed in the cavity.

Some embodiments of the present disclosure provide a semiconductor device, including: a first die including a signal pad region and a power pad region; a redistribution layer (RDL) over the first die; a plurality of first connectors over the RDL and at a side of the RDL opposite to the first die; a plurality of second connectors over the RDL and at the side opposite to the first die; a second die including a signal pad region and a power pad region, wherein the second die is face-to-face and electrically connected to the first die through the first connectors and the RDL, wherein a center of the second die is laterally shifted with respect to a center of the first die so as to correspond the signal pad region of the first die to the signal pad region of the second die; and a package substrate bonded to the first die through the second connectors and the RDL.

Some embodiments of the present disclosure provide a semiconductor device, including: a first die; a redistribution layer (RDL) over the first die; a plurality of first connectors over the RDL and at a side of the RDL opposite to the first die; a plurality of second connectors over the RDL and at the side opposite to the first die; a second die face-to-face and electrically connected to the first die through the first connectors and the RDL, wherein a center of the second die is laterally shifted with respect to a center of the first die; and a package substrate bonded to the first die through the second connectors and the RDL, wherein the package substrate includes a recess receiving the second die; wherein at least a portion of the second connectors extend laterally past edges of the first die.

Some embodiments of the present disclosure provide a method for fabricating a semiconductor device, including: providing a first die including a signal pad region and a power pad region; forming a redistribution layer (RDL) over the first die; forming a plurality of first connectors over the RDL and at a side opposite to the first die; forming a plurality of second connectors over the RDL and at the side opposite to the first die; face-to-face bonding a second die to the first die through the first connectors, wherein a center of the second die is laterally shifted with respect to a center of the first die; and bonding a package substrate to the first die through the second connectors.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
   a first die including a signal pad region and a power pad region;
   a redistribution layer (RDL) over the first die;
   a plurality of first connectors over the RDL and at a side of the RDL opposite to the first die;
   a plurality of second connectors over the RDL and at the side opposite to the first die;
   a second die including a signal pad region and a power pad region, wherein the second die is face-to-face and electrically connected to the first die through the first connectors and the RDL, and a center of the second die is laterally shifted with respect to a center of the first die; and
   a package substrate bonded to the first die through the second connectors and the RDL;
   wherein the power pad region of the first die and the signal pad region of the second die are non-overlapping from a top view perspective.

2. The semiconductor device of claim 1, wherein the second die includes a high bandwidth memory (HBM) die.

3. The semiconductor device of claim 1, wherein the signal pad region of the first die is substantially directly above the signal pad region of the second die.

4. The semiconductor device of claim 1, wherein the signal pad region and the power pad region of the second die are within the edges of the RDL.

5. The semiconductor device of claim 1, wherein the package substrate is a printed circuit board (PCB).

6. The semiconductor device of claim 1, further comprising a third die disposed side-by-side to the first die.

7. A semiconductor device, comprising:
   a first die including a signal pad region and a power pad region;
   a redistribution layer (RDL) over the first die;
   a plurality of first connectors over the RDL and at a side of the RDL opposite to the first die;
   a plurality of second connectors over the RDL and at the side opposite to the first die;
   a second die including a signal pad region and a power pad region, wherein the second die is face-to-face and electrically connected to the first die through the first connectors and the RDL, wherein a center of the second die is laterally shifted with respect to a center of the first die so as to correspond the signal pad region of the first die to the signal pad region of the second die; and
   a package substrate bonded to the first die through the second connectors and the RDL;
   wherein the package substrate includes a through-hole, and the second die is at least partially disposed in the through hole; and
   a center of the through-hole is laterally shifted from a center of the package substrate.

8. The semiconductor device of claim 7, wherein ball grid array (BGA) balls are disposed over the package substrate at a side opposite to the first die, and the BGA balls surround the through-hole.

9. The semiconductor device of claim 8, wherein, from a top view perspective, a number of columns of the BGA balls at one side of the through-hole is different from a number of columns of the BGA balls at another side of the through-hole.

10. The semiconductor device of claim 9, wherein at least one of the BGA balls is directly beneath the first die.

11. A semiconductor device, comprising:
    a first die including a signal pad region and a power pad region;
    a redistribution layer (RDL) over the first die;
    a plurality of first connectors over the RDL and at a side of the RDL opposite to the first die;
    a plurality of second connectors over the RDL and at the side opposite to the first die;
    a second die including a signal pad region and a power pad region, wherein the second die is face-to-face and electrically connected to the first die through the first connectors and the RDL, and a center of the second die is laterally shifted with respect to a center of the first die; and
    a package substrate bonded to the first die through the second connectors and the RDL;
    wherein the power pad region of the second die and the signal pad region of the first die are non-overlapping from a top view perspective.

12. A semiconductor device, comprising:
    a first die;
    a redistribution layer (RDL) over the first die;
    a plurality of first connectors over the RDL and at a side of the RDL opposite to the first die;
    a plurality of second connectors over the RDL and at the side opposite to the first die;
    a second die face-to-face and electrically connected to the first die through the first connectors and the RDL, wherein a center of the second die is laterally shifted with respect to a center of the first die; and
    a package substrate bonded to the first die through the second connectors and the RDL, wherein the package substrate includes a recess receiving the second die;
    wherein at least a portion of the second connectors extend laterally past edges of the first die, and
    the first die has a die size greater than a die size of the second die.

13. The semiconductor device of claim 12, wherein the second die includes a high bandwidth memory (HBM) die.

14. The semiconductor device of claim 12, wherein a center of the recess is laterally shifted from a center of the package substrate.

15. The semiconductor device of claim 12, wherein the package substrate is an interposer.

16. The semiconductor device of claim 12, wherein the recess extends in a thickness direction through the package substrate.

17. The semiconductor device of claim 12, further comprising a third die disposed side-by-side to the first die.

* * * * *